United States Patent [19]

Barajas

[11] 4,373,974

[45] Feb. 15, 1983

[54] SOLDER COMPOSITION

[75] Inventor: Felix Barajas, Huntington Beach, Calif.

[73] Assignee: McDonnell Douglas Corporation, Long Beach, Calif.

[21] Appl. No.: 250,209

[22] Filed: Apr. 2, 1981

[51] Int. Cl.³ .............................................. B23K 35/34
[52] U.S. Cl. ........................................ 148/24; 148/25
[58] Field of Search .................................. 148/24, 25

[56] References Cited
U.S. PATENT DOCUMENTS 3,684,533  8/1972  Conwicke ............................. 148/24
3,762,965  10/1973  Amin ..................................... 148/24

Primary Examiner—P. D. Rosenberg
Attorney, Agent, or Firm—Max Geldin

[57] ABSTRACT

Novel solder composition or solder cream, particularly adapted for soldering components in electronic circuitry, comprising finely divided solder metals such as tin and lead, dispersed in a vehicle containing viscosity controlling agents, organic solvents, and a rosin or rosin derivative as a flux. By employing a narrow range of rosin-containing vehicle, that is between 13 and 14%, and between 86 and 87% of solder metal, by weight of the solder composition, and fine particle size solder metal of from 40 to 70 microns, the formation of solder balls is essentially eliminated, thus avoiding the necessity of removing such solder balls.

25 Claims, 5 Drawing Figures

SOLDER COMPOSITION

BACKGROUND OF THE INVENTION

This invention relates to novel solder compositions or solder creams, and is particularly concerned with the provision of solder compositions especially adapted for soldering components in electronic circuitry, which substantially eliminates the undesirable formation of solder balls.

A solder cream is a material that is capable of being applied to a substrate or surface in a specific pattern using screening or analogous methods which can subsequently undergo fusing to provide an electrical joint or interface commonly described as a solder joint. The solder cream generally consists of metallic balls, e.g. of 45–70 micron diameter, of various alloys such as tin-lead, tin-lead-silver, tin-lead-gold, etc., contained in a vehicle including a flux comprised of rosin such as wood rosin, or derivatives thereof. In addition, a suspension medium is present in the vehicle and is combined with the flux to provide a paste substance of uniform texture, consistency, and improved surface wetting. In addition, metallic corrosion and metallic settling is retarded, by incorporation of additional components in the vehicle.

In electronic circuitry, solder creams or compositions are employed to secure miniature electronic components to a circuit on a substrate such as ceramic or glass, or the like. Circuits similar to those used on printed circuit boards are produced on the substrates. In certain instances, the circuit is located on one side of the substrate, with pads being provided in certain areas, other parts of the circuit being covered with an insulating material.

The solder cream having a paste-like consistancy is applied, for example by means of a silk screen, to the pads on the circuit board. Thereafter, the electronic components are carefully positioned with their peripheral contacts on the solder cream-coated pads. When all of the components are thus in place, the board, with such components temporarily positioned and retained thereon by the solder cream, can be placed in a vapor reflow system and subjected to a sufficiently high temperature to cause the metal content of the solder cream to liquefy and the contacts of the electronic components to be fused and to adhere to the pads on the circuit board.

Many solder creams or compositions have been developed and are commercially available. However, such prior art and commercially available solder creams have the disadvantage that during soldering many small solder balls are formed around and between each of the solder pads. Many of these solder balls create electrical short circuits between adjacent pads. Heretofore, it was necessary to scrub the circuit board and the contacts of the components with a small, stiff brush in an effort to remove the solder balls. The main problem, however, is that many solder balls form beneath the components, and it is difficult, and sometimes impossible, to scrub or remove solder balls from the areas of the circuit board immediately beneath the components. Thus, due to this problem, short circuiting exists and the rejection rate for such boards has been very high, e.g. of the order of 60%. In other instances, even though a circuit board may test satisfactorily, vibration, temperature changes and other factors may loosen other solder balls and cause failures. Under the circumstances, the removal of solder balls by conventional cleaning methods has proved unsatisfactory.

U.S. Pat. No. 3,762,965 discloses a solder composition for electronic circuitry comprising a vehicle containing an active chloride-containing compound capable of removing surface oxides of the solder metals, a thixotropic agent, rosin or a derivative thereof, and an organic solvent, and having soldering metals such as a combination of tin, lead and silver, dispersed in the vehicle. As noted in the table in the patent, the weight proportion of vehicle including rosin flux, in the compositions can range from 15 to 25%, and the range of soldering metals, from 75 to 85%.

Although the patent states that the solder composition thereof results in reduced solder ball formation, applicant has found that when employing the above noted ranges of proportions of vehicle and soldering metals, some solder balls are still formed, particularly beneath the electronic components as noted above, and which are difficult to remove.

U.S. Pat. No. 2,480,723 discloses a solder-flux mixture containing a rosin type flux, and alkaline ingredients such as ammonium hydroxide solution, and a mineral oil, having particles of solder metals such as tin, lead and silver suspended therein. According to the patent, the ratio of solder powder to the rosin is preferably around 20 to 1 or 15 to 1, at which the flux residue is not excessive upon completion of the solder bond, the patent noting that in economical practice, the ratio of solder to flux and suspending material is about 2 to 1.

U.S. Pat. No. 3,073,270 discloses a brazing paste comprising broadly from 60 to 90% of a powdery joining metal component, 10 to 40% of an emulsion vehicle, and a flux in the amount of 0 to 20% by weight of the composition.

U.S. Pat. No. 3,684,533 discloses a solder composition comprising a liquid vehicle including a rosin in a range, e.g. between 30% and 60% of the vehicle, the vehicle constituting, according to the table in the patent, between 15 and 40%, and the metals content between about 60 and 85%, by weight of the solder composition.

It is accordingly an object of the present invention to provide a solder composition or solder cream which is especially adapted for soldering components in electronic circuitry, and which minimizes formation of undesirable solder balls causing short circuits between electronic components. Another object is to provide a solder composition formed of conventional components or ingredients, yet compounded so as to reduce or eliminate solder ball formation. Yet another object is to provide a solder composition or solder cream especially designed for soldering electronic components in electronic circuitry on a substrate, which contains soldering metals dispersed in a vehicle having suitable flow and viscosity characteristics, and which contains a rosin flux, the proportions of vehicle containing rosin flux, in relation to the soldering metals, and the particular size of the solder metals, being such as to provide a composition which produces few, if any, solder balls in the spaces between electronic components, between adjacent solder pads or beneath electronic components, following the fusing or the soldering operation.

SUMMARY OF THE INVENTION

The above objects and advantages are achieved according to the invention by the provision of a soldering composition comprising, by weight, (a) 13–14% of a liquid vehicle containing a viscosity controlling agent and a rosin type flux, and (b) 86 to 87% of a finely divided solder metal dispersed in said vehicle, the particle size of the solder metal or metals ranging from 40 to 70 microns.

It has been found that the above noted narrow range of proportions of liquid vehicle including rosin type flux, and solder metal, and fine particle size range of solder metal or metals, are critical for obtaining efficient soldering particularly of electronic components in electronic circuits, while obtaining excellent results with respect to lack of formation of solder balls, during the soldering operation. An optimum soldering composition according to the invention has been found to be one which consists of 13.5% of such liquid vehicle and 86.5% of solder metal, by weight, and 40 to 60 micron size solder metals.

Briefly, the invention accordingly provides a solder composition especially adapted for soldering components in electronic circuitry, whereby following soldering essentially no solder balls are formed, comprising finely divided solder metal dispersed in a liquid vehicle containing (a) a thixotropic agent, (b) an organic solvent and (c) a rosin type flux, the particle size of said metal ranging from 40 to 70 microns, said liquid vehicle being present in an amount of 13 to 14%, and said solder metal being present in an amount of 86 to 87%, by weight of said composition.

DETAILED DESCRIPTION OF THE INVENTION COMPOSITION AND PREFERRED EMBODIMENTS

The invention will be more clearly understood by reference to the description below, taken in connection with the accompanying drawings wherein.

Figure 1:
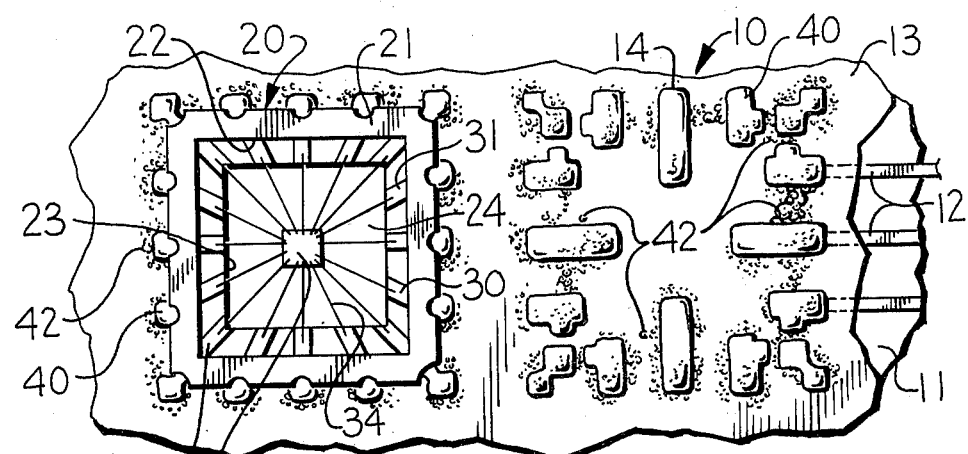
FIG. 1 is an enlarged, fragmentary, plan view of a portion of a circuit board, with a component mounted thereon, to illustrate the problem solved by the present invention when utilizing conventional solder creams.
Figure 2:
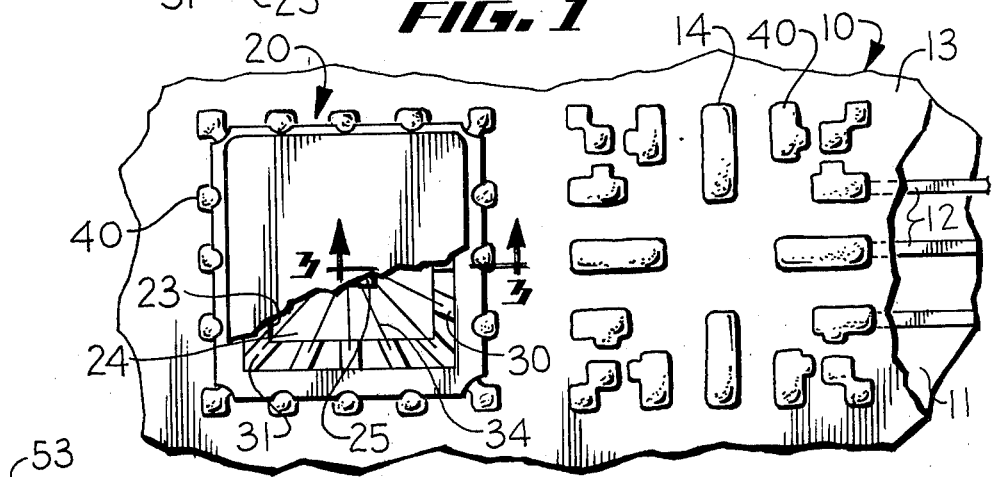
FIG. 2 is a view similar to FIG. 1 showing the nature of the circuit board and component after use of the solder cream of the present invention.
Figure 3:
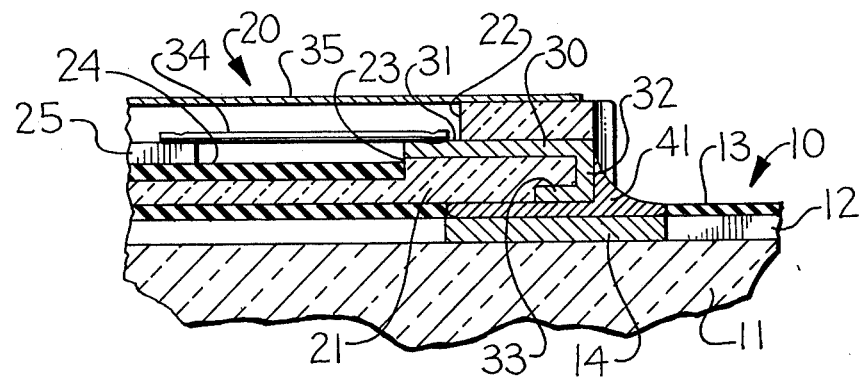
FIG. 3 is a further enlarged, fragmentary, sectional view through the component and the circuit board, and taken substantially along the line 3—3, FIG. 2.

With reference to the drawings, and with reference primarily to FIGS. 1, 2 and 3, there is illustrated a circuit board 10 which comprises a substrate 11 which may be of any nonelectrical conductive material such as ceramic, plastic or the like. In the manner familiar to this art, a circuit 12 is printed or otherwise deposited upon the substrate 11. Thereafter, a coating 13, which may be lacquer or the like, is deposited on the major portion of the circuit 12, leaving exposed areas or pads 14. The circuit 12 may be formed from any suitable metallic material such as gold, platinum, copper, or the like which has an affinity for solder.

Chip carriers, indicated generally at 20, (or other electrical components) are intended for electrical attachment to the exposed pads 14 on the circuit board through use of the solder cream of this invention. Such chip carriers are generally made from a nonconducting material, such as ceramic, and, in the present instance, are illustrated as being generally square. Each chip carrier includes a body 21 which has stepped openings 22 and 23 therein. An insulating material 24 is deposited within the opening 23 and retained therein by any suitable cement.

The chip carriers are also provided with contacts 30 of a conducting material such as gold or the like. The contacts 30 are embedded in the carrier body 21 and have portions extending into the recess 22 as at 31. The contacts 30 extend to the outer edge of the body 21, over that edge as at 32, and inwardly as at 33 to expose contact portions that are configured generally to correspond with the pattern of the pads 14 on the circuit board 10. The inner ends 31 of the contacts 30 are connected to the chip 25 by means of small wires 34. Each of the ends of the wires 34 have their connections secured as by welding. A cover 35 is generally secured to the body 21 to protect the wires 34 and the chip 25. Since the chip carriers 20 are physically 15 to 20 millimeters square, and the chip 25 may be in the order of 1 to 2 millimeters square, the wires 34 must be secured utilizing special welding machinery under microscopic viewing.

The solder cream of the present invention is used by first applying it to each of the pads 14. This may be accomplished by means of a syringe-type dispenser or preferably by screening the solder cream onto the pads 14.

Following application of the solder cream to the pads 14, the chip carriers 20 are carefully positioned whereby the portions 33 of the contacts 30 are immersed in the solder cream shown at 40 in FIGS. 1 and 2. The chip carriers are thus temporarily retained in position by means of the solder cream, its viscosity being such as to form a soft attachment.

Figure 5:
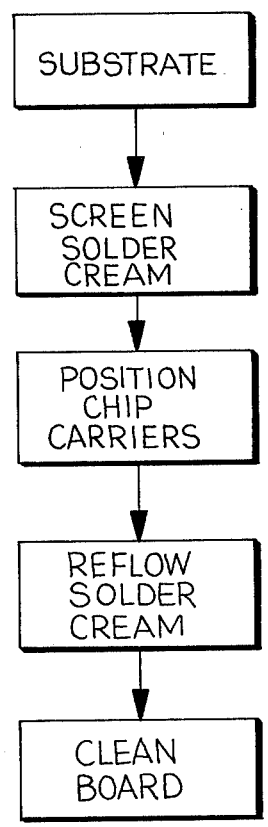
FIG. 5 is a diagramatical view illustrating the major steps in one process for using the solder cream of this invention.

Thereafter, the circuit board containing the temporarily positioned chip carriers is placed in a vapor reflow system and heated, by means of the vapor therein, to a temperature sufficient to flow the metal component of the solder cream. Upon removal of the board from the vapor reflow system, the board is subjected to a vapor bath of a suitable solvent which cleans the board and removes residual flux and its vehicle therefrom. These steps in the process are illustrated in FIG. 5 and the final solder connection is as illustrated at 41 in FIG. 3 which, through the wires 34 and contacts 30, electrically connect selected areas of the chip 25 to each individual pad 14.

As illustrated in FIG. 1, solder cream heretofore available and used created a number of solder balls 42 which were difficult to remove from the circuit boards and which frequently were grouped randomly in a manner to produce electrical shorts between the pads 14, and therefore between the selected areas of the chip 25. By means of brush cleaning, the majority of these solder balls could be removed from areas about the periphery of each chip carrier. However, solder balls which existed between the chip carriers and the circuit boards were virtually impossible to remove, this resulting in a very high rejection rate of the completed circuit boards. Due to the nature of the chips employed and the number on each circuit board, such completed boards have a value of tens-of-thousands of dollars. Through use of the solder cream of the present invention, virtually no solder balls were created, with the boards appearing as best illustrated in FIG. 2. This has reduced the rejection rate for completed boards to a very low level. Even in the case of those boards previously acceptable, and from which the solder balls have been scrubbed therefrom, a large portion of the boards failed subsequent tests, such as vibration, due to the migration or heat expansion of the solder balls left after the scrubbing process.

The vehicle for the solder metals of the solder composition of the invention is a liquid composition having desirable viscosity characteristics and which maintains the solder metals in suspension without settling of the fine solder metal particles. Such vehicle can include viscosity controlling agents, organic solvents, rosin, or derivatives thereof, as flux, and other components such as organic amines.

Thus, one component of the vehicle is a compound which increases the viscosity of the vehicle to the desired consistency, such as a thixotropic agent, and which can also function as a suspension medium to prevent settling of the solder particles. The amount of thixotropic agent is within the range 0.5–10%. Any thixotropic agent can be used, provided that it does not leave a residue insoluble in organic solvents (e.g., trichloroethylene) on the solder metal, after the firing operation. Common thixotropic agents are disclosed by Eirich, "Rheology," Academic Press, New York, 1967, Vol. 4, page 457. A preferred thixotropic agent is hydrogenated castor oil (Baker Castor Oil Co. "Thixatrol". Carboxy Methyl cellulose also can be used.

The second component of the vehicle is an organic solvent which provides the proper consistency for the vehicle. Such organic solvent is present in the range of 30 to 60%, by weight of the vehicle. Any of the common organic solvents, preferably non-chlorinated, may be used for this purpose, such as ketones, e.g., acetone, methyl ethyl ketone, methyl isobutyl ketone, and the like, aliphatic alcohols, such as butyl alcohol, esters such as alkyl acetates, mineral spirits, the terpenes (e.g., beta-terpineol), ethylene glycol, glycerol, aromatic hydrocarbons such as benzene, toluene, xylene, and phenol, and mixtures thereof. Preferably a high boiling solvent such as 2-butoxy (ethyl) ethyl acetate, 2-butoxy ethyl acetate, ethylene glycol or beta-terpineol, is used.

The third component of the vehicle is a rosin type flux, that is rosin or derivatives thereof. Rosin, the non-steam volatile fraction of pine oleoresin, is a mixture of five isomeric diterpene acids, the most abundant component being abietic acid. The terminology "rosin and derivatives thereof" includes rosin derived from gum, wood or tall oil, the acids in rosin such as abietic acid, and any of their derivatives, such as "Staybelite," "Poly-Pale," "Dimerex," "Vinsol," etc. The amount of rosin type flux present in the vehicle can range from 20–65%, preferably 30–60%, by weight of the vehicle.

Other components such as amine hydrochlorides, e.g., propylamine hydrochloride, hydroxyl substituted aliphatic amines, and aliphatic amines such as isopropyl amine, can be present, e.g., to remove surface oxides of the solder metals. These materials can be present in amounts ranging from 0.01 to 10% by weight of the vehicle.

The solder compositions of the invention contain finely divided solder metals, in the form of metallic balls or particles, dispersed in the vehicle. The solder metals can be any of the conventional single or multiphase metals normally used for soldering, including gold, silver, tin, germanium, silicon, antimony, bismuth, lead, indium, gallium, zinc, copper, phosphorus, particularly tin, lead and silver, and alloys and mixtures thereof. Alloys or mixtures of tin-lead, tin-lead-silver, tin-silver and lead-silver, for example, can be employed. A preferred mixture of solder metals employed in the solder composition of the invention consists essentially of a mixture of lead, tin and silver, which can contain from 61.5 to 62.5% tin, 1.75 to 2.25% silver, and the balance lead. A particularly preferred solder metal mixture consists of 36% lead, 62% tin and 2% silver. The solder metal particles should be finely divided, and should have a particle size not greater than 70 microns, usually 40 to 70 micron size, preferably 40 to 60 micron size.

The above noted composition of the vehicle and of the solder metals forming the solder composition are essentially disclosed, for example, in above U.S. Pat. Nos. 3,762,965 and 3,684,533, and such disclosures are incorporated herein by reference.

The solder compositions of the invention are prepared by admixing the solder metals and the vehicle including rosin flux in certain critical proportions, as noted below. It has been common practice heretofore to employ at least 15% of vehicle (or total organic materials) including rosin flux, by weight of the solder composition, the remainder being solder metals, as disclosed in the Table of each of the above U.S. Pat. Nos. 3,762,965 and 3,684,533. In many commercial solder creams, a substantially higher percentage of vehicle including rosin flux, e.g., of the order of 50% by weight, is employed, particularly for soldering electronic components, whereby to "flood" the areas about the components which are to be soldered into an electronic circuit.

As previously noted, according to the present invention, it has been discovered that by limiting the quantity of vehicle or total organic components including rosin, to a low and narrow critical range of proportions, the undesirable solder balls generally obtained during soldering, are virtually eliminated. Thus, it has been found unexpectedly that the use of a narrow range of 13 to 14%, and optimally 13.5%, of vehicle containing rosin flux, and 86 to 87%, optimally 86.5%, of solder metals, e.g., a mixture of very small particles of 40 to 70 micron size, of lead, silver and tin, by weight, is effective in practically entirely eliminating the presence of solder balls following soldering.

On the other hand, in practice when the amount of vehicle employed is less than 13%, e.g., 12.5, or more than 14%, e.g., 14.5%, by weight of the composition, solder balls are found to be present following soldering, and such solder balls commence to form when the amount of vehicle utilized is reduced to about 12.9%, or increased to about 14.1%, by weight.

The result is that in attaching electronic components to circuit boards employing the solder composition of the invention, the rejection rate due to the absence of undesirable solder balls, has been reduced to less than 5%, as contrasted to the much higher rejection rate of the order of 60% employing conventional solder compositions, for completed circuit boards. This is a very important economic factor, since some of these completed circuit boards are very expensive.

The solder compositions of the invention can be employed for soldering components such as capacitors, resistors, integrated circuits and their packages or carriers, transistors, diodes, etc., onto a circuit carried on a substrate.

The solder composition of the invention can be applied to any suitable substrate such as metal pads on a circuit board to which contacts of electronic components are to be soldered. Such application of the solder composition or solder cream can be made by use of metal screening to apply the solder cream to the pads. However, other modes of applying the solder cream in addition to screen printing, can be employed, including, for example, dipping the objects to be soldered into the solder composition, or employing syringe techniques.

Thereafter, the solder is heated to a temperature at which the solder becomes molten and a highly adherent fused solder bond is formed. For this purpose, vapor phase soldering is a preferred method, although other methods of heating the solder such as the use of belt furnaces, and infra-red heating can be employed. Any atmosphere for heating can be used, e.g., air, or an inert atmosphere employing an inert gas such as nitrogen.

The following table shows examples of soldering compositions according to the invention, the amounts noted being in terms of weight percent:

TABLE

| Compositions | A | B | C | D | E | F | G |
| --- | --- | --- | --- | --- | --- | --- | --- |
| Vehicle (weight percent) | 13.5 | 13.0 | 14.0 | 13.2 | 13.8 | 13.4 | 13.8 |
| Abietic acid | 59 | 59 | 59 | 50 | 50 | — | 35 |
| 2-Butoxy (ethyl) ethyl acetate | 31 | 31 | 31 | 40 | — | 50 | 55 |
| Hydrogenated caster oil | 8 | 8 | 8 | 7 | 7 | 6 | 7 |
| Isopropyl amine | 2 | 2 | 2 | 3 | 3 | 4 | 3 |
| Ethylene glycol | — | — | — | — | 40 | 40 | — |
| Metal (weight percent) | 86.5 | 87 | 86 | 86.8 | 86.3 | 86.6 | 86.2 |
| Lead | 36 | 36 | 36 | 40 | 37 | 4 | 36 |
| Tin | 62 | 62 | 62 | 60 | 63 | 96 | 62 |
| Silver | 2 | 2 | 2 | — | — | — | 2 |

Figure 4:
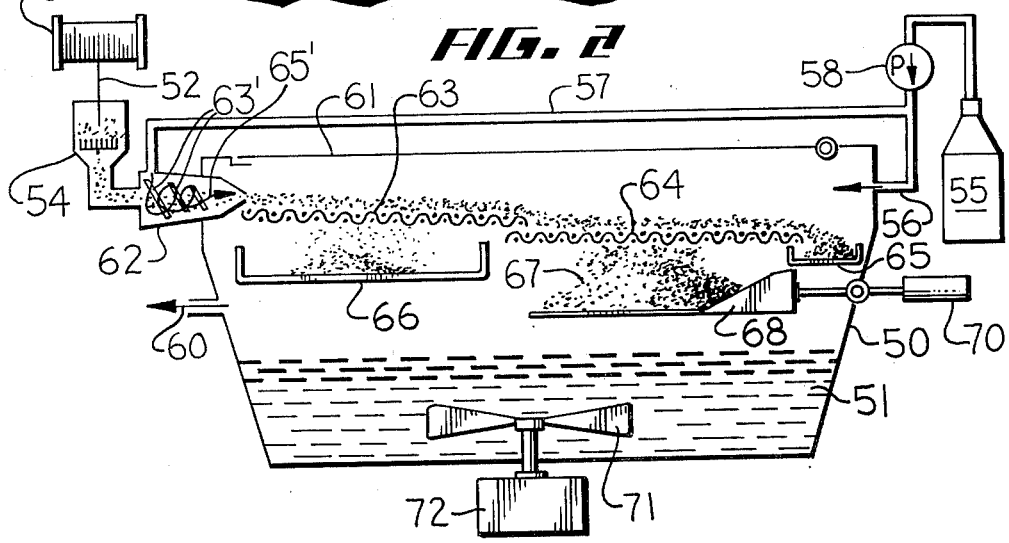
FIG. 4 is a schematic and diagramatic view illustrating one method of manufacture of the solder cream of this invention.

FIG. 4 illustrates one means for making the solder cream of the invention. With reference to FIG. 4 the present solder cream may be manufactured using an apparatus similar to that illustrated therein. A so-called dry box 50 may be employed in which is deposited a quantity of the vehicle and flux 51. The metallic component of the solder cream may be in the form of a wire 52 dispensed from a supply 53 into a cutter, shaver or grinder, illustrated at 54, to reduce the metal to small particles. The box 50 is maintained with an inert atmosphere of nitrogen or the like, supplied from a source 55 through conduits 56 and 57 and a pump 58. The conduit 56 communicates with the interior of the box 50, there being a small bleed orifice 60 in order to maintain the atmosphere. The box may also be provided with a cover 61 for access thereto.

The conduit 57 extends to a nozzle 62 which receives the small metallic particles from the cutter 54. These particles travel through the interior of the nozzle 62 and, by contact therewith, are reduced to substantially round, minute particles. As noted in FIG. 4 of the drawings, nozzle 62 has internal ribs 63' which cause the particles to spiral therein in an ever-reducing spiral path, as illustrated by the arrow 65'—thus creating the round nature of the particles. The metal particles, being round, can be used more efficiently in the silk screening operation, when applying the solder cream to a substrate, since particles of any other shape tend to clog the silk screen and produce an uneven distribution of the solder cream on the substrate. The metallic particles leave the nozzle 62 and are blown onto a suitable fine-mesh screen 63 of a size smaller than the size of the desired particles. Thereafter the metallic particles travel onto a screen 64, having a mesh to permit travel there-through of the metallic particles of the desired size. Particles larger than the desired size may be collected by a tray 65 with the fine particles being collected by a tray 66. The desired size particles, as at 67, are dispensed from the screen 64 onto a tray 68, the weight thereof, as determined by a counterbalance 70, serving to deliver the particles into the vehicle or flux 51. Thereafter, the particles 67 are mixed with the vehicle 51 by means of a mixer 71 driven by a suitable power source 72.

While FIG. 4 illustrates one method of combining the desired size metallic particles with the vehicle to produce the solder cream, in practice, other similar methods may be used and several additional screening steps may be employed to insure the desired size of the metallic material. This operation is carried out within the inert nitrogen, or the like, atmosphere, substantially to eliminate oxidation of the metallic particles and to produce a solder cream substantially free of oxides which tend to inhibit attachment to the contacts of the chip carriers and the pads on the circuit boards, and to eliminate contaminated solder joints.

The following are some specific examples of further practice of the invention:

EXAMPLE I

In producing solder composition or solder cream A of the above Table, a lead-tin-silver metallic mixture in the proportions of 36% lead, 62% tin and 2% silver, is formed into a very finely divided powder which is substantially free of exides. The particle size of the metal mixture is between 40 and 70 microns.

The metallic powder is blown into a chamber, the metal balls are screened so that the particle size thereof is between 40 and 70 microns, and the particles are then mixed with the vehicle, such operations being carried over in an inert atmosphere, e.g., of nitrogen, to eliminate oxidation of the metals, as described in detail above and illustrated in FIG. 4. In this example, the flux-containing vehicle and metal mixture were combined in a percentage of 13.5% of the flux-containing vehicle and 86.5% of the metallic mixture, by weight. The viscosity of the resulting flux composition or cream was 500,000±10% centipoises at 20° C.

The solder cream was used to secure miniature electronic components to a ceramic substrate. A printed circuit was produced on the substrate. The circuit was on one side of the substrate, with pads composed of platinum and gold being provided in certain areas, other parts of the circuit being covered with an insulating material.

A screen was placed over the circuit and the pads, and the above solder cream was screened onto the pads on the circuit board. Thereafter, electronic components including capacitors and resistors were carefully positioned with their peripheral contacts on the solder cream-coated pads.

When all of the components were thus in place, the board, with such components temporarily positioned and retained thereon by the solder cream, was placed in a vapor phase system and subjected to a temperature of 215° C. Since the metal mixture or alloy employed has a melting range between 177° C. and about 189° C., the system temperature melted the metallic particles in the solder cream and fused or adhered the contacts of the components, to the pads on the circuit board, leaving the components securely positioned in place and soldered to the pads on the board.

Following the soldering operation, it was observed that their were no solder balls formed on the substrate either between or about the contacts of the electronic components or beneath the components, as described above and illustrated in FIG. 2 of the drawing.

EXAMPLE II

The procedure of Example I was followed employing respectively, solder compositions B through G of the above Table.

Substantially the same results were obtained, namely, effective soldering of the electronic components occurred, with no formation of solder balls formed on the substrate either between the contacts of the electronic components or beneath the components.

EXAMPLE III

The procedure of Example I was followed except that the solder composition or cream contained in one case 12.5% of the vehicle and 87.5% solder metals, and in another case 14.5% vehicle and 85.5% solder metals, by weight.

It was observed that a number of solder balls were present between and around the electronic components and also solder balls were present beneath the components, as described above and illustrated in FIG. 1 of the drawing, and although the solder balls between the components could be essentially removed by means of a stiff brush, the solder balls beneath the components were almost impossible to remove, resulting in an unacceptable circuit board.

From the foregoing, it is seen that the invention provides a novel solder composition comprised of essentially conventional components including vehicle containing rosin flux and solder metals, but by the employment of a very narrow range of vehicle in the solder composition, and fine particle size solder metal, it has been found that when such solder composition is employed particularly for soldering electronic components in an electronic circuit, there is practically complete elimination of solder balls causing shorts, between, around and beneath the electronic components, thus providing acceptable electronic circuits, whereas when employing the same solder compositions, but with proportions of rosin flux-containing vehicle outside the 13 to 14% range according to the invention, regardless of particle size of the solder metals, unacceptable electronic circuits were obtained following soldering, containing solder balls between and beneath electronic components, resulting in a large number of rejects and substantial economical loss.

While particular embodiments of the invention have been described for purposes of illustration, it will be understood that various changes and modifications within the spirit of the invention can be made, and the invention is not to be taken as limited except by the scope of the appended claims.

What is claimed is:

1. A solder composition especially adapted for soldering components in electronic circuitry, whereby following soldering essentially no solder balls are formed, said solder composition comprising finely divided solder metal dispersed in a liquid vehicle containing (a) a thixotropic agent, (b) an organic solvent and (c) a rosin type flux, the particle size of said metal ranging from 40 to 70 microns, said liquid vehicle being present in an amount of 13 to 14%, and said solder metal being present in an amount of 86 to 87%, by weight of said composition.

2. The composition of claim 1, employing 13.5% of said liquid vehicle and 86.5% of said solder metal by weight.

3. The composition of claim 2, the particle size of said metal ranging from 40 to 60 microns.

4. The composition of claim 1, said metal being selected from the group consisting of gold, silver, tin, germanium, silicon, antimony, bismuth, lead, indium, gallium, zinc, copper, phosphorus, and alloys and mixtures thereof.

5. The composition of claim 1, said metal being alloys or mixtures of tin, lead and silver; tin and lead; tin and silver; and lead and silver.

6. The composition of claim 5, employing 13.5% of said liquid vehicle and 86.5% of said solder metal by weight.

7. The composition of claim 1, said thixotropic agent being hydrogenated caster oil or carboxy methyl cellulose.

8. The composition of claim 1, said organic solvent being 2-butoxy (ethyl) ethyl acetate, 2-butoxy ethyl acetate, ethylene glycol or beta-terpineol.

9. The composition of claim 1, said rosin type flux comprising abietic acid.

10. The composition of claim 1, wherein said vehicle consists of 0.5–10% of (a), 30–60% (b) and 20–65% of (c), by weight.

11. The composition of claim 1, said thixotropic agent (a) being hydrogenated castor oil, said organic solvent (b) being 2-butoxy (ethyl) ethyl acetate, and said rosin type flux (c) comprising abietic acid.

12. A solder composition especially adapted for soldering components in electronic circuitry, whereby following soldering essentially no solder balls are formed, said solder composition comprising finely divided solder metal dispersed in a liquid vehicle containing (a) 0.5–10% hydrogenated castor oil, (b) 30–60% 2-butoxy (ethyl) ethyl acetate and (c) 20–65% of a rosin type flux comprising abietic acid, the particle size of said metal ranging from 40 to 70 microns, said liquid vehicle being present in an amount of 13 to 14%, and said solder metal being present in an amount of 86 to 87%, by weight of said composition.

13. The composition of claim 12, said vehicle including 0.01–10% of isopropyl amine.

14. The composition of claim 13, said vehicle consisting of 59% abietic acid, 31% 2-butoxy (ethyl) ethyl acetate, 8% hydrogenated castor oil and 2% isopropyl amine by weight.

15. The composition of claim 14, said liquid vehicle being present in an amount of 13.5% and said solder metal being present in an amount of 86.5%, by weight of said composition.

16. The composition of claim 15, the particle size of said metal ranging from 40 to 60 microns.

17. The composition of claim 12, said metal being alloys or mixtures of tin, lead and silver; tin and lead; tin and silver; and lead and silver.

18. The composition of claim 16, said solder metal being a tin-lead-silver alloy.

19. The composition of claim 18, said solder metal being an alloy of 62% tin, 2% silver and 36% lead.

20. The composition of claim 16, said solder metal being a tin-lead alloy.

21. A solder composition especially adapted for soldering components in electronic circuitry, whereby following soldering essentially no solder balls are formed, said solder composition comprising finely divided solder metal dispersed in a liquid vehicle containing (a) a thixotropic agent, (b) an organic solvent and (c) a flux, the particle size of said metal ranging from 40 to 70 microns, said liquid vehicle being present in an amount of 13 to 14%, and said solder metal being present in an amount of 86 to 87%, by weight of said composition.

22. The composition of claim 21, the metal particles of said solder metal being round.

23. A solder composition especially adapted for soldering components in electronic circuitry, whereby following soldering essentially no solder balls are formed, said solder composition comprising finely divided solder metal dispersed in a liquid vehicle containing (a) a thixotropic agent, (b) an organic solvent and (c) a flux, the metal particles of said solder metal being round, said liquid vehicle being present in an amount of 13 to 14%, and said solder metal being present in an amount of 86 to 87%, by weight of said composition.

24. A solder composition especially adapted for soldering components in electronic circuitry, whereby following soldering essentially no solder balls are formed, said solder composition comprising finely divided solder metal dispersed in a liquid vehicle containing (a) a thixotropic agent, (b) an organic solvent and (c) a flux, said liquid vehicle being present in an amount of 13 to 14%, and said solder metal being present in an amount of 86 to 87%, by weight of said composition.

25. The composition as defined in claim 20, the metal particles of said solder metal being round.

* * * * *